United States Patent [19]

Goff et al.

[11] Patent Number: 5,029,274

[45] Date of Patent: Jul. 2, 1991

[54] APPARATUS AND METHOD FOR TESTING THE INTEGRITY OF WIRING ENSEMBLES

[75] Inventors: Jerry E. Goff, El Dorado Springs; Jon F. Wells, Colorado Springs, both of Colo.

[73] Assignee: Cline Professional Corp., Lakewood, Colo.

[21] Appl. No.: 488,466

[22] Filed: Feb. 26, 1990

Related U.S. Application Data

[63] Continuation of Ser. No. 219,098, Jul. 14, 1988, abandoned.

[51] Int. Cl.$^5$ ............................................. G01R 17/00
[52] U.S. Cl. ...................................... 324/66; 324/540; 324/542; 324/556; 377/26
[58] Field of Search ................. 324/66, 539, 540, 542, 324/527, 556; 379/10, 12, 25, 26

[56] References Cited

U.S. PATENT DOCUMENTS

| | | | |
|---|---|---|---|
| 3,217,244 | 11/1965 | Glover | 324/540 |
| 3,826,977 | 7/1974 | Woodworth | 324/66 X |
| 4,418,312 | 11/1983 | Figler et al. | 324/542 X |
| 4,445,086 | 4/1984 | Bulatao | 324/66 |
| 4,471,293 | 9/1984 | Schnack | 324/66 X |
| 4,772,845 | 9/1988 | Scott | 324/66 |
| 4,814,693 | 3/1989 | Coben | 324/66 |

Primary Examiner—Kenneth Wieder
Assistant Examiner—Robert W. Mueller
Attorney, Agent, or Firm—Timothy J. Martin

[57] ABSTRACT

An apparatus and method for testing the integrity of wiring cables provides a transmitter and a receiver that electrically connect to opposite ends of group of wires to be tested. The transmitter produces a voltage test signal applied to a test set of wires and a different voltage reference signal is applied to a reference set of wires. At the receiver, indicator circuits interconnect the wires to a common bus. The reference signal is applied to the common bus and, when the test signal is present, the indicators operate to produce a display. The test signal can be cycled through a plurality of test sets making up the entire test group.

32 Claims, 5 Drawing Sheets

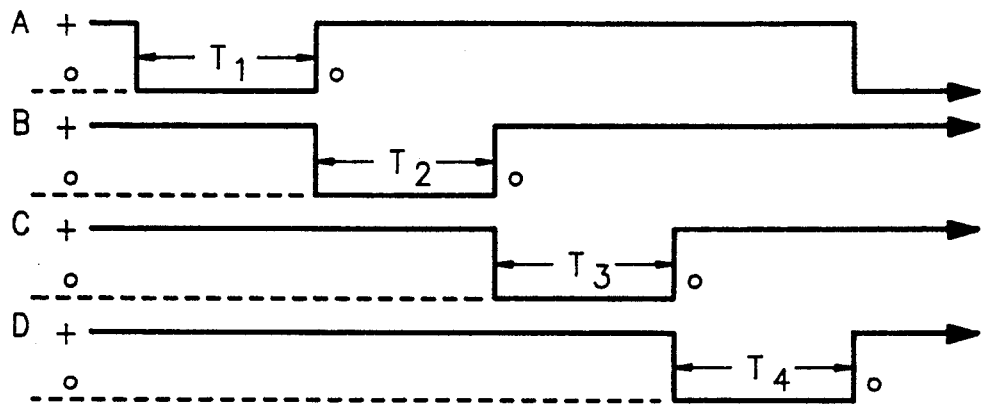
Fig. 5
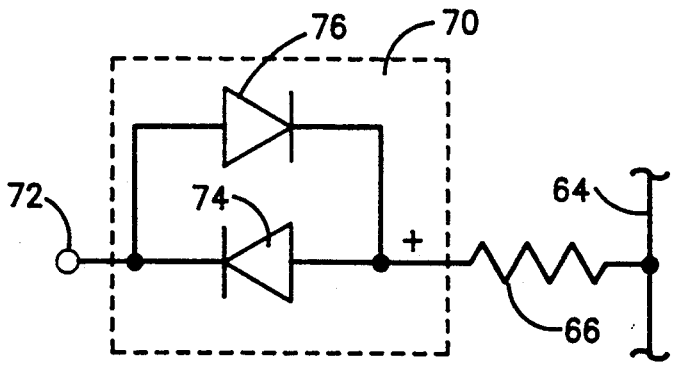
Fig. 6
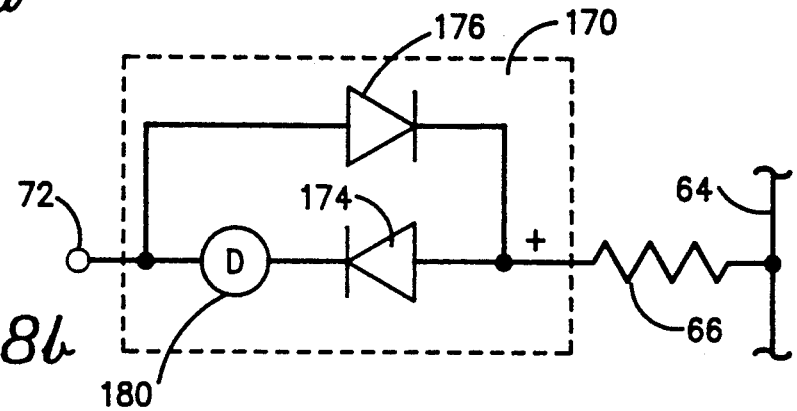
Fig. 8a
Fig. 8b

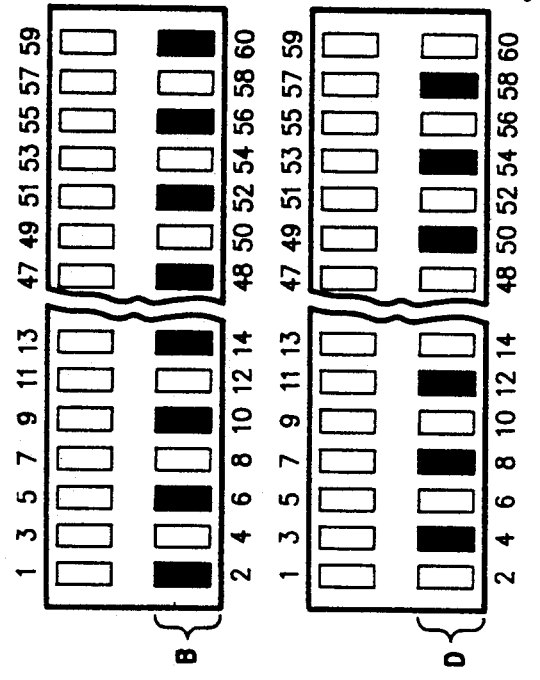
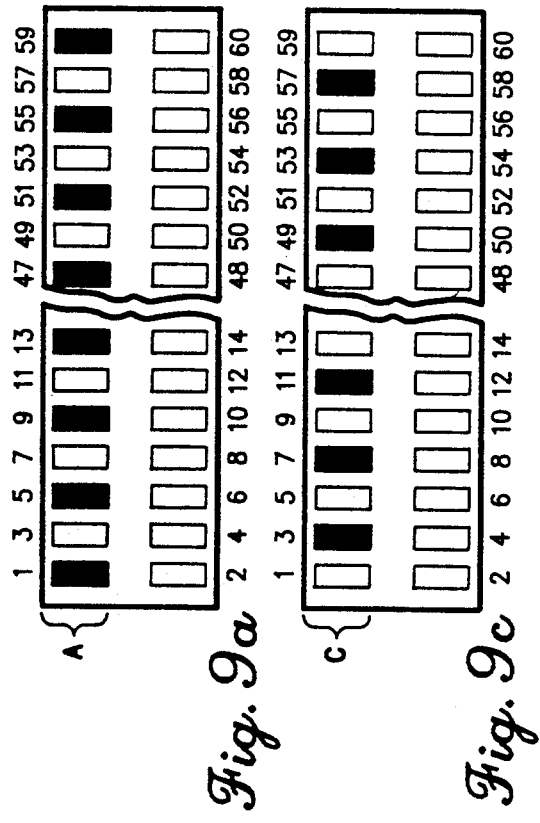
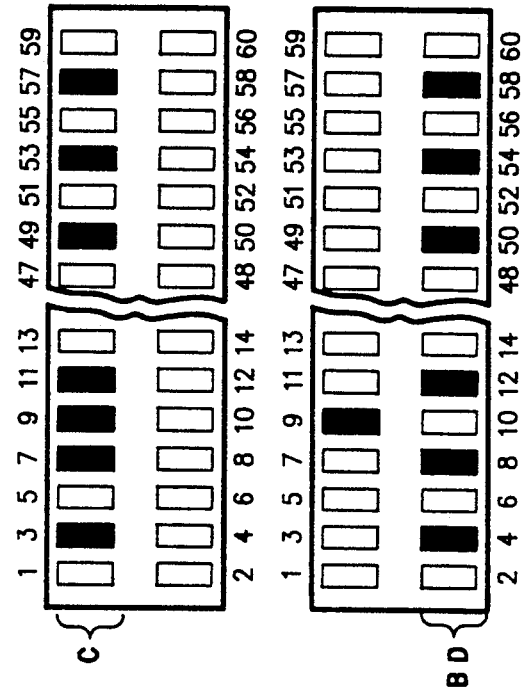
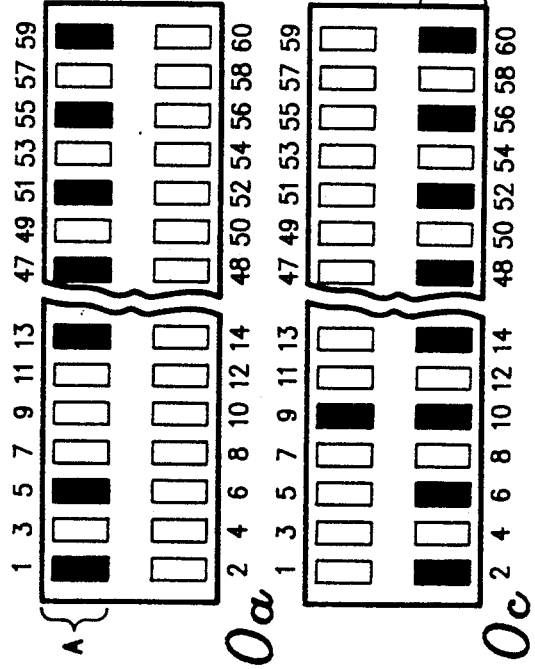

APPARATUS AND METHOD FOR TESTING THE INTEGRITY OF WIRING ENSEMBLES

This is a continuation of co-pending application Ser. No. 219,098 filed on July 14, 1988, now abandoned.

FIELD OF THE INVENTION

The present invention broadly relates to apparatus and the methods for testing wiring ensembles wherein a plurality of individual electrically conductive wires extend between two stations. With greater particularity, the present invention relates to the testing of cable harnesses and their terminal connectors between two use stations in order to identify electrical shorts between wires in the cable harness to identify open circuit conditions for wires in the harness.

BACKGROUND OF THE INVENTION

In modern times, there has been a proliferation of electronic equipment placed in use by business and industry. Many of such electronic devices require electrical interconnects between use stations or terminal boxes. In many cases, these electrical interconnects utilize an ensemble of individual wires bundled as a cable or "wiring harness" to provide a plurality of inputs and outputs for the connected devices. By way of example, but not limitation, such electrical interconnects are commonly found within networked computer systems, between a central processing unit and its accessory electronic devices (printers, modems, display screens, etc.), telephone communications equipment, music entertainment systems and the like. In order to facilitate interconnection of these various electronic devices, the interconnects are often provided with multi-terminal plugs at each of their ends which plugs may then be inserted into the respective electronic apparatus thus establishing electrical communication therebetween.

The increased use of cable harnesses has resulted in the need for apparatus and methods for testing the integrity of the cable harness and their associated terminal plugs in order to discover a compromised electrical circuit condition within the harness. Such testing is not simply a matter of testing the continuity of each individual wire since short circuits between two wires or caused by defective end plug terminals of the harness may give false continuity readings. As the number of wires increase in a given cable harness, then, the difficulty of testing continuity while eliminating short circuit possibilities increases as to mathematical square of the number of wires to be tested. Thus, where a wiring harness has thirty (30) wires, it is necessary to conduct 900 individual continuity checks to ensure proper functioning of the cable harness. This even assumes that it is convenient to have access to the opposite ends of the cable harness at a single test location.

As a result of the need for better cable harness testing techniques, there has been developed different test apparatus for cable harnesses. Most of these devices, however, require the presence, at a single location, of both ends of the cable harness to be tested. Both ends of the cable are electrically connected to the device and the device then scans the individual wires in the cable harness in order to detect open circuit paths and short circuits. Naturally, where a cable harness is extensive in length or where it is mounted internally of walls or other equipment, the retrieval of both ends of the cable to a common location is often not practicable.

Another testing device has sought to eliminate the problem of the presence of both cable ends at a single location by utilizing a shorting terminal plug placed on one end of the cable harness to be tested while the testing device is placed at the other end. The shorting plug establishes one wire of the cable harness to be a dedicated return path for test signals that interrogate remaining wires. While this device provides some improvement, it has corresponding problems. For example, if the wire defining the dedicated return path is defective, the test operator will then have to test several wires before determining whether the dedicated return wire is defective or whether other wires in the cable harness have malfunctions. Further, determination of shorts between wires is difficult, indeed, where there are very long cables, any indication of shorts may be ambiguous.

Accordingly, there remains a need within the industry for imprived apparatus and methods for testing the integrity of cable harnesses. This need is felt by testing technicians, installers of equipment and even quality control personnel for manufacturing companies. There is a further need for such devices which are easy to use and inexpensive in cost.

SUMMARY OF THE INVENTION

It is an object of the present invention to provide a new and useful apparatus and method for testing the integrity of a plurality of individual electrically conductive wires such as those arranged in cable harnesses and the like.

It is another object of the present invention to provide a testing apparatus and method for cable harnesses which has transmitter and receiver modules which may be positioned remotely from one another at opposite ends of an ensemble of wires, such as a cable harness, so that a test operator may monitor the functioning of the cable harness at the receiver location.

A further object of the present invention is to provide an apparatus wherein a transmitter generates a test signal that is applied individually to one set of wires in the cable harness and a reference signal that is applied to another set of wires in the cable harness so that multiple circuit paths are provided to the receiver for the reference signal thus substantially eliminating the probability of reference path malfunction for the individually interrogated test wire set.

It is a still further object of the present invention to provide a method and apparatus which sequentially tests a plurality of test sets of wires within the harness while utilizing wires which are not being tested for a given sequencing step to provide a reference signal for a receiver.

According to the broad form of the present invention, then, an apparatus is provided to test the integrity of an ensemble of wires such as those usually found in cable harnesses. In its broad form, the apparatus according to the preferred embodiment of the present invention includes a transmitter portion and a receiver portion. Preferably, the transmitter and receiver portions are housed independently of one another as modules so that they may be placed on opposite ends of a cable harness to be tested. The transmitter portion has a plurality of electrical contacts which are operative to establish electrical communication with a first end of each member of a group of wires to be tested. The transmitter portion has signal generating and control circuitry that produces a test signal at a test voltage and a reference signal at a reference voltage with the test and reference signals having different electrical potential from one another. The signal generating and control circuitry applies the test signal to a test set of wires in the group to be tested and a reference signal to a reference set of wires in the group.

The receiver portion, in turn, has a plurality of second electrical contacts which are operative to establish electrical communication with a second end of each member of the group of wires. The receiver portion includes a common electrical bus and a plurality of indicator circuits. Each of the second electrical contacts is interconnected with the common electrical bus by an associated indicator circuit. Each indicator circuit has an indicator device operative to generate active output in response to the presence of the test signal at its respective second electrical contact, and at least some of the indicator circuits have an electrical shunt operative to place the common electrical bus at the reference voltage without generating the active output in response to the presence of the reference signal at their respective second electrical contacts. A power source is provided to supply electrical power to both the transmitter and the receiver devices. Preferably, the power source is located in the transmitter and the receiver device is driven by power transmitted through the tested cable.

While the above description represents the broad form of the present invention, the preferred embodiments encompasses more detailed structure, as well. For example, indicator circuits are preferably formed by oppositely biased diodes with one of the diodes being a light emitting diode to form the indicator means while the other diode provides the electrical shunt so that each indicator circuit has a shunt. Other displays may also be used to replace the indicator diode without departing from the inventive concept. Examples include liquid crystal displays. Where such displays are bidirectional, a biasing diode opposite the shunt diode is used to control the electrical path. Further, it is preferred that the signal and control means sequentially apply a test signal to a plurality of test sets which are mathematically non-intersecting but where the mathematical union of the test set forms the group of wires to be tested. The signal and control circuitry is then operative to repeatedly cycle the test signal to the test sets and the reference signal to the plurality of reference sets. The reference sets are each formed by at least some of the wires in the harness other than the test set; it is preferred that each reference set be the set of wires in the group of wires mathematically complementary to a respective test set. The signal and control means repeatedly cycles application of the test signals by means of a clock which produces clock pulses at first periodic intervals and a decade counter. Preferably, the reference signal is a positive voltage signal and the test signal is of lower voltage (such as ground potential) than the positive signal although the inverse is within the scope of the present invention. The indicator circuits can include components that stabilize the electrical potential of the common electrical bus. Preferably the power source is a battery which is located within the transmitter, with the receiver being a separate module from the transmitter and being remotely powered by the battery through the group of wires to be tested.

The broad form of the preferred method of the present invention contemplates the testing of the integrity of a plurality of individual electrically conductive wires defining a cable between two stations and contemplates a series of steps to conduct this test. First, a common electrical bus is provided at a receiver end of the group or wires to be tested. The next step is to electrically interconnect each of the receiver ends and said common electrical bus by means of an indicator circuit with each indicator circuit including means for generating an active output and at least some of said indicator circuits including electrical shunts. A test signal is then applied at a test voltage to a selected test set of wires in the group to be tested at a transmitter end of each of the wires opposite the receiver end thereof, and a reference signal is simultaneously applied at a reference voltage different from the test voltage to a selected reference set of wires in the group of wires to be tested at the transmitter ends thereof. The method then includes the generation of an active output for each indicator circuit that receives a test signal at the receiver end of its respective wire while coupling the reference voltage to the common electrical bus through each shunt for each indicator circuit that receives a reference signal at the receiver end of its respective wire without producing an active output by its respective indicator means.

The preferred method according to the present invention may further include the step of stabilizing the reference voltage at the common electrical bus. The method may be enhanced by the step of separating the group of wires into a plurality of test sets each having a corresponding reference set of wires with the test sets being mathematically non intersecting after which both the test signal and the reference signal are respectively and sequentially applied to the test sets and to the corresponding reference sets over a test cycle. The cycle may then be repeated at periodic intervals. Preferably, the active outputs are visually displayed in any convenient manner.

These and other objects of the present invention will become more readily appreciated and understood from a consideration of the following detailed description of the preferred embodiment when taken together with accompanying drawings, in which:

BRIEF DESCRIPTION OF THE DRAWINGS

FIG. 5 is a graph showing the representative test signal as actually applied in the preferred embodiment of the present invention;

FIG. 6 is a truth table showing the test signal as applied to a plurality of set of electrical contacts or "pins" for the transmitter.

FIG. 8A shows a preferred embodiment of the indicator circuit according to the preferred embodiment of the present invention utilized in the circuit of FIG. 7;

FIG. 8B shows an alternate embodiment of the indicator circuit used in the circuitry shown in FIG. 7;

FIGs. 9A-9D are representative visual displays for the receiver showing the display of the active outputs for a properly functioning tested cable; and FIGS. 10A-10D show the displays resulting from malfunctions located in the tested cable by means of the present invention.

DETAILED DESCRIPTION OF THE PREFERRED EMBODIMENT

The present invention is directed to an apparatus and method for testing an ensemble of wires which are used to interconnect two electrical stations. While the preferred embodiment of the present invention is described with respect to cable harness, such as those typically used to interconnect two electronic devices, the principles of the present invention are readily applicable to any cable-like group of wires which extend between and interconnect two terminal points. Thus, for purposes of this description, it should be understood that the term "station" contemplates any terminal point, such as electronic devices, junction boxes, switch boxes, to name a few. It should also be appreciated that, when testing cable harnesses, the present apparatus and method not only tests the individual wire within the harness but also their associated connectors which form terminal plugs for the group of wires.

Figure 1:
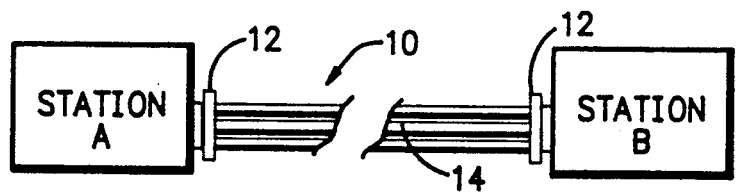
FIG. 1 is a diagrammatic representation of a pair of typical stations electrically connected to one another by means of a cable harness.

As may be seen in FIG. 1, a typical electrical cable 10 is used to interconnect a use station A and a use station B. To this end, wiring harness or cable 10 includes a pair of terminal end connectors 12 which provide terminal end contacts to a group of individual wires packaged together in a cable 14 and are operative to establish electrical contact therewith so that the individual wires may be connected to corresponding electrical contacts at station A and station B.

Figure 2A:
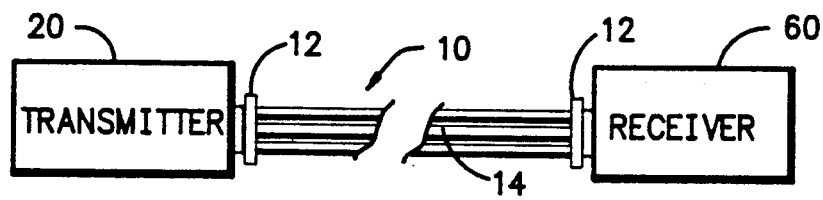
FIG. 2A is a diagrammatic representation of the present invention showing transmitter and receiver modules connected to the cable of FIG. 1 for purposes of testing the same.
Figure 2B:
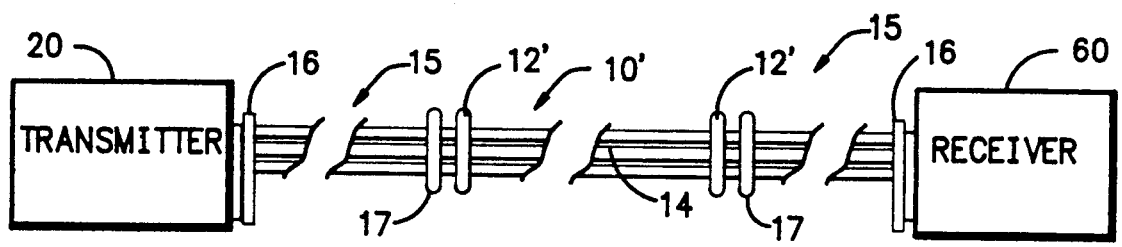
FIG. 2B is a diagrammatic representation of the transmitter and receiver shown in FIG. 2A used with adapters for testing a different cable than that shown in FIG. 2A.

As is shown in FIG. 2A, the present invention is designed to test cable harness 10 and includes transmitter 20 and a receiver 60. Transmitter 20 receives terminal end connector 12 in order to establish electrical communication with the group of wires that form cable 14 at a first end thereof, and receiver 60 connects with the opposite terminal connector 12 to establish communication with a second end of the wires forming cable 14. As is shown in FIG. 2B, transmitter 20 and receiver 60 may be used with a wiring harness 10 which has a different terminal connector configuration than that normally received by transmitter 20 and receiver 60. Here, it is necessary that adapters 15 be employed, with each adapter 15 including a first terminal end connector 16 that respectfully mates with transmitter 20 and receiver 60. At the opposite end of adapter 15 from connector 16 is a terminal end connector 17 which mates with end connectors 12' of the cable harness 10' to be tested. It should be understood that, with the use of adapters, the types of cable harness which can be tested with the present invention is almost unlimited. FIG. 2B shows adapters which decrease the number of wires interogated, but it should be readily apparent to the ordinarily skilled person that adapters could be constructed to test harnesses of any number of wires.

In greater detail, therefore, it should be appreciated that the preferred embodiment of the present invention is constructed as a transmitter portion 20 and a receiver portion 60 that are preferably formed as separately housed modules which may be remotely positioned with respect to one another for purposes of testing an ensemble of wires such as those in a cable harness. Accordingly, the present invention avoids the requirement of having the terminal ends of the wiring harness present at a single location in order to conduct the integrity test.

Figure 3:
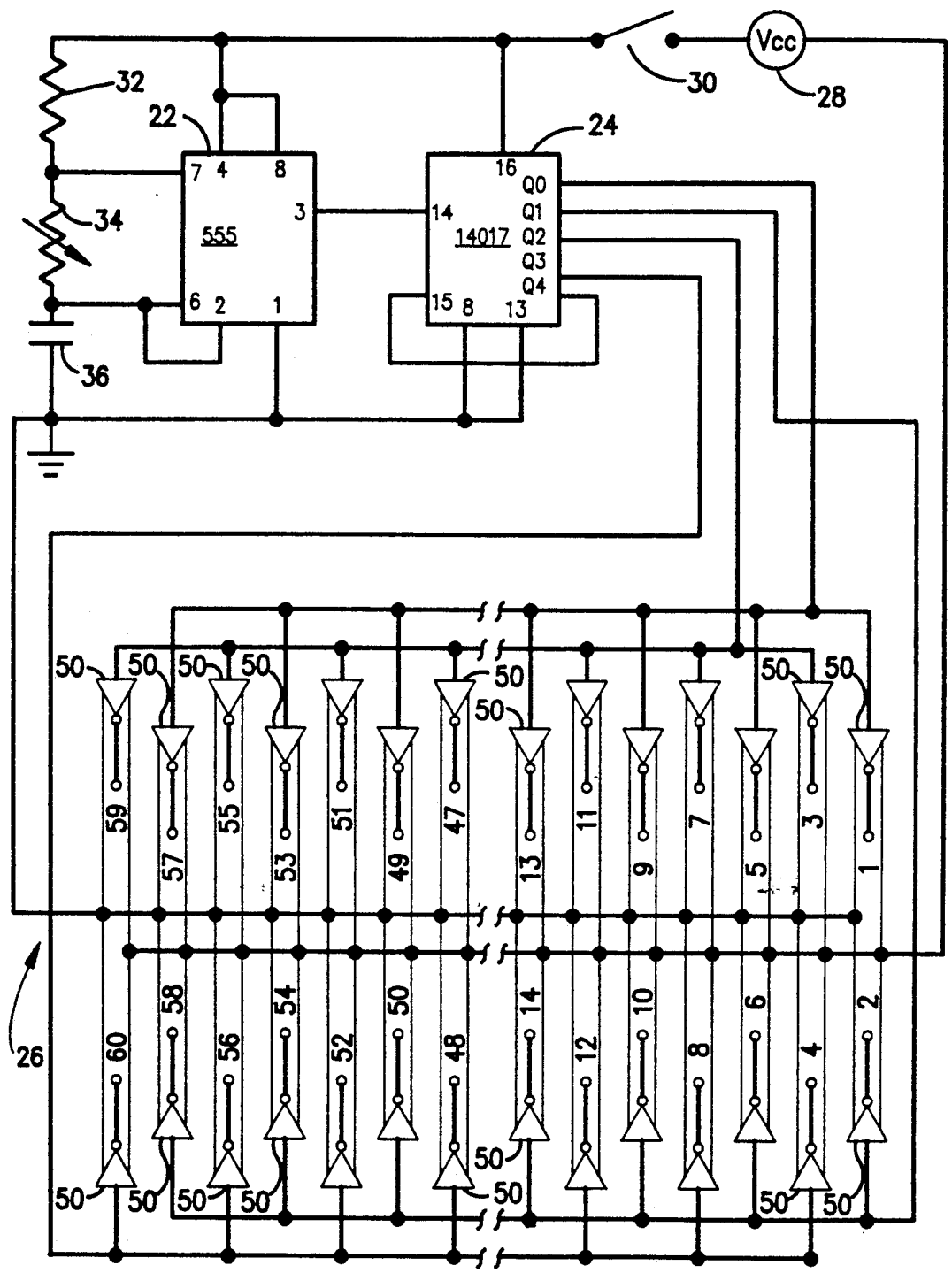
FIG. 3 is a schematic diagram of the circuitry of the transmitter shown in FIGS. 2A and 2B.

As is shown in FIG. 3, transmitter portion 20 includes signal generating and control means in the form of a clock 22 and a decade counter 24 which produce test and reference signals to be applied to a wire to be tested. The test and reference signals are produced at output connector 26 which is in the form of a complementary electrical connector adapted to receive a terminal connector 12 or 16. A power source 28 is provided for transmitter portion 20 and is preferably in the form of a battery, although it should be appreciated that power source 28 could be any convenient DC voltage source. For ease of portability, power source 28 is preferably a nine volt battery. Power source 28 is connected through a switch 30 to provide a positive voltage potential to both clock 22 and decade counter 24.

Clock 22 is preferably a 555 micro-processing device, and is operative to produce a periodic output in the form of a clock pulse. As is shown in FIG. 3, the positive voltage is applied to pins 4 and 8 of clock 22 with pins 4 and 8, along with the positive voltage source 28, being commonly connected to pin 7 through a resistor 32. Pin 7 is connected through a resistor 34 to pin 6, with pin 6 being directly connected to pin 2 of counter 22. Pin 6 is connected to ground potential by means of capacitor 36 and pin 1 of counter 22 is directly connected to ground. With this configuration, a clock pulse is generated at pin 3 of counter 22. Resistor 32 sets the duration of the clock pulse while resistor 34 and capacitor 36 set the frequency for the pulse so produced. If desired, resistor 34 may be a variable resistor so that the frequency of the clock pulse may be varied as desired. Resistor 32 may be a 1 mega ohm resistor so that each clock pulse has a duration of approximately 100 milliseconds. Where capacitor 36 is 2.2 microfarads, resistor 34 should be a 100 ohm resistor to give a cycle time of approximately 1 second.

Decade counter 24 is connected to the positive voltage source 28 through its pin 16 and is driven by the clock pulse generated by clock 22. To this end, decade counter 24 is preferably a 4017 micro-processing chip. Pin 14 of decade counter 24 is directly connected to pin 3 of clock 22, and pins 8 and 13 of decade counter 24 are connected to ground. Decade counter 24 has a plurality of outputs Q0, Q1, Q2, Q3 and Q4 which are used according to the present invention. Decade counter 24 is operative upon the receipt of a first pulse from clock 22 to produce a positive voltage signal at output Q0 while outputs Q1-Q4 remain at ground potential. Upon receiving a second clock pulse, decade counter 24 shifts its positive voltage output to Q1 with output Q0 going to ground potential. For each successive pulse, then, decade counter 24 shifts its positive voltage output sequentially until a positive voltage output is generated at Q4 which, due to its connection to pin 15 of decade counter 24, causes decade counter 24 to reset thereby applying the positive voltage to output Q0. This reset pulse completes one cycle for decade counter 24 and a second cycle commences with output Q0 generating a positive output upon resetting. It should be understood from this description that either fewer or greater number of outputs of decade counter 24 may be employed without departing from the scope of this invention.

Figure 4:
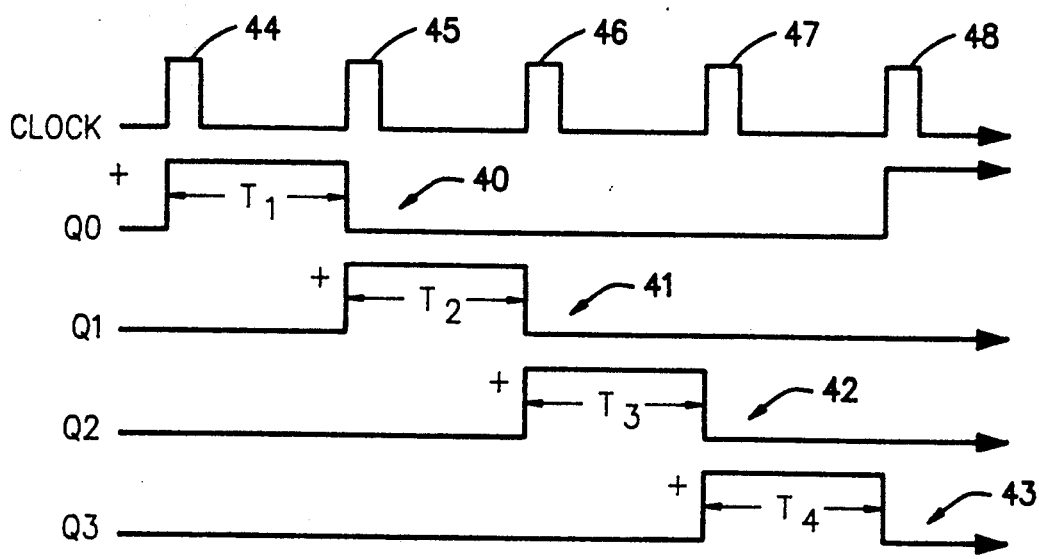
FIG. 4 is a graph showing clock pulses generated by the clock of FIG. 3 in the corresponding voltage outputs which control the test signals to be applied to a group of wires to be tested.

FIG. 4 shows the clock pulse at graph 38. Here, each clock pulse has a pulse width corresponding to the duty cycle established by resistor 32. The outputs of Q0–Q3 are respectively shown at graphs 40–43. Thus, as is shown in graph 40, Q0 has a positive voltage output during a time $T_1$ in response to the first clock pulse 44. Second clock pulse 45 causes output Q0 to return to ground potential and output Q1 to shift positive for time $T_2$. After time $T_2$, clock pulse 46 causes output Q2 to go high and returns output Q1 to ground potential. Output Q2 is high for time $T_3$ after which pulse 47 causes output Q2 to go to ground potential and causes output Q3 to go high for time $T_4$. Clock pulse 48 resets decade counter 24 which causes output Q3 to go to ground potential and causes output Q0 to again go positive, as is shown in graph 40.

The outputs of outputs Q0–Q3 may, if desired, be used for test signals and reference signals, as hereinafter described. However, in the preferred embodiment of the present invention, it is desirable that the outputs of Q0–Q3 be inverted to minimize current drain on power source 28. Accordingly, as may be seen in FIG. 3, output connector 26 has a plurality of contact pins, with connector 26 being chosen as a sixty pin connector. Each pin of connector 26 has an associated inverter/buffer 50 so that the output of a respective inverter/buffer 50 is applied as a test signal to its respective pin and, thus, to a wire in cable harness 10. Each of inverter/buffers 50 is driven by a respective output Q0–Q3 of decade counter 24 and, as is understood in the art, inverter/buffers 50 are powered by power source 28 and are connected to ground as is shown in FIG. 3. In the preferred embodiment of the present invention, inverter/buffer 50s are provided by ten hex inverter/buffer integrated circuits known commonly designated as 4049 devices.

From the foregoing, it should be appreciated that the sixty pins of connector 26 may conveniently be grouped into four independent test sets with each test set containing fifteen pins. It is preferred that every other odd pin and every other even pin form the various sets. Accordingly, test set "A" can be represented by those pins having a pin number $4n-3$, test set "B" are those pins numbered $4n-2$, set "C" are those pins numbered $4n-1$ and set "D" are those pins numbered $4n$ (where n is the integers between 1 and fifteen, inclusive). When the voltage signals shown in FIG. 4 are applied to the sets of pins, inverters 50 invert the signal so that test sets A, B, C and D have inverted signals, as is shown in FIG. 5. Thus, during time $T_1$, the pins in set A are pulled down to ground potential, during time $T_2$, set B is pulled to ground potential, during time $T_3$ set C is pulled to ground potential, and during time $T_4$ set D is pulled to ground potential. This can be graphed in the truth table shown in FIG. 6 wherein the representation "0" indicates a signal at ground potential whereas the designation "1" indicates a positive voltage potential corresponding to VCC. It may now be appreciated that, in the preferred embodiment of the present invention, the positive voltage signal provides a reference signal while the ground voltage signal provides an interrogating test signal.

Figure 7:
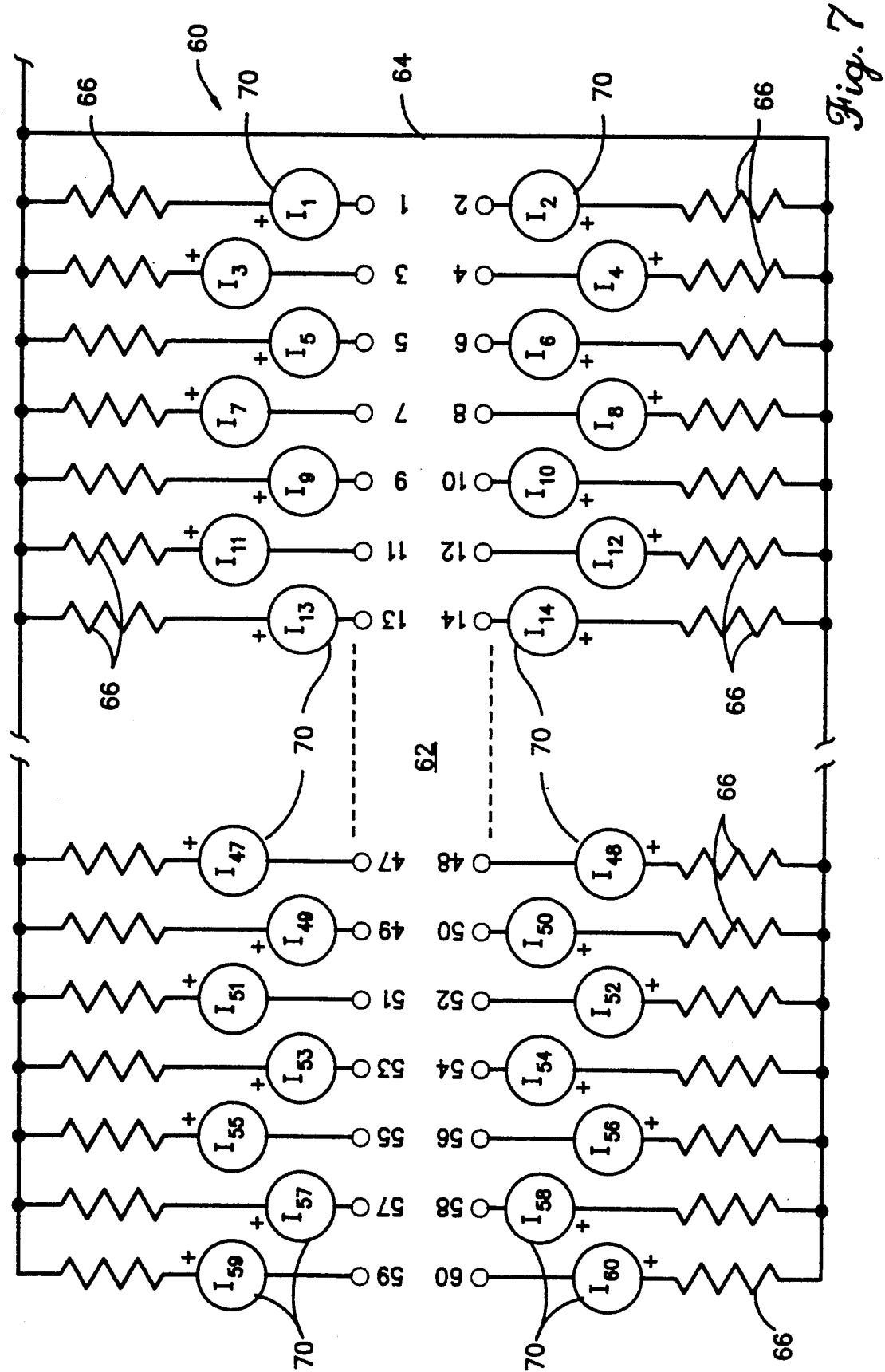
FIG. 7 is a schematic representation of circuitry of the receiver according to the preferred embodiment of the present invention.

FIG. 7 shows the receiver circuit according to the preferred embodiment of the present invention where it may be seen that a sixty pin connector 62 is adapted to receive a terminal connector 12 (or a connector 16 of an adapter 14). Connector 62 establishes electrical communication with the receiver end of the cable to be tested. Receiver 60, shown in FIG. 7, has a common bus line 64 and each of the 60 pins of connector 62 is tied to this common bus line through a stabilizing resistor 66 and an indicator circuit, represented by respective circuits $I_1$–$I_{60}$; each indicator circuit in its respective stabilizing resistor being connected in series with one another.

A representative indicator circuit according to the preferred embodiment of the present invention is shown in FIG. 8A. Here, an indicator circuit 70 is shown connected to a representative pin 72 and comprises an indicator light emitting diode 74 and a shunt diode 76 connecting and parallel with diode 74. Diodes 74 and 76 are oppositely biased with respect to one another so that current will flow in both directions but on active output will only be produced when current flows through diode 74. Hence, when pin 72 receives a positive voltage signal or reference signal, shunt diode 76 conducts current so that common bus 64 is placed at a positive voltage potential. Since each of the pins of connector 62 correspond to the sets of pins for connector 26, the pins of connector 62 and their associated indicator circuits are divided into sets corresponding to sets A–D as discussed above. While it is preferable that each of indicator circuits $I_1$–$I_{60}$ be provided with a shunt diode 76, it is only necessary that some members of each set A–D be provided with such shunt diodes in order for bus 64 to always be at a positive voltage.

Since a positive voltage is present on bus 64, it may now be seen that interrogation of a pin by a test signal will cause a respective indicator diode to light. This situation corresponds to the application of a ground signal at pin 72 of FIG. 8A. When the grounding test signal is present, current flows from bus line 64 through stabilizing resistor 66 and through light emitting diode 74 thus indicating that a test signal is present on the respective pin 72.

FIG. 8B shows an alternate embodiment of the indicator circuit wherein indicator circuit 170 utilizes a shunt diode 176, a biasing diode 174 and any bidirectional indicator element 180. It should be readily apparent to the ordinarily skilled person in the art that any type of indicating means whether uni-directional or bi-directional may be employed with the circuit described above, so that LEDs, lightbulbs, electroluminescent displays, LCD displays and the like may be employed as desired. Where liquid crystal displays are used, it is preferable that the liquid crystal elements corresponding to each pin of connector 62 be gathered together in a single liquid crystal display panel.

The operation of the present invention can now be appreciated more fully with respect to FIGS. 9A–9D and 10A–10D and FIGS. 5 and 6. When counter 24 produces the test signal applied to set A (at time $T_1$), sets B–D receive the positive reference signal. As a result of shunt diode 76, this positive voltage is applied to common bus 64, and pins nos. 1, 5, 9, . . . , 53 and 57 are pulled down. Assuming that there are no open wires in the tested wiring harness, FIG. 9A shows a display in which an every other LED 74 in the upper row is illuminated, as is shown. At time $T_2$, the test signal is removed from set A and applied to set B so that sets A, C and D receive the positive reference voltage that is applied to common bus 64 through shunt diodes 76. Again, for a good cable harness, the resultant display is shown at FIG. 9B. This process is repeated at times $T_3$ and $T_4$ for a test signal on sets C and D, respectively, which correspond to the display as shown in FIG. 9C and FIG. 9D.

In the event that the cable harness that is tested has a defective wire, when the test signal is applied to the set that contains that wire, its corresponding indicating diode does not illuminate since it does not receive the test signal at its respective contact pin. For example, should line 9 be open, the display will indicate the fault, as is shown in FIG. 10A. If line 9 is shorted to another line that is contained in set C, the display shown in FIG. 10B results wherein indicating a circuit $I_9$ produces an active output. If line 9 is shorted to a member of set B, the resulting display is shown in FIG. 10C, and, where line 9 is shorted to a member of set D, the resulting display is shown in FIG. 10D. Should line 9 be shorted to a member of its own set, this condition may be discovered by a dimished luminescence for both of the indicating light emitting diodes corresponding to these lines due to the current drain on the voltage source. Accordingly, all possible short and open circuit conditions may be discoverable by the apparatus according to the preferred embodiment of the present invention.

It may now be readily appreciated by the ordinarily skilled person in this field that the present invention allows the transmitter and receiver to be independent modules which may be remotely positioned from one another. Thus, the transmitter may be connected to a transmitter and the cable to be tested and the device activated. Only minimal current drain exists at this time since power source 28 is only driving the low power clock 24 and decade counter 26. The testing operator may then go to a remote location corresponding to the opposite end of the cable harness to be tested and electrically connect receiver 60 thereto. The testing operator then observes the cycle display to determine open and short conditions, if any, in the tested cable harness.

It should now also be understood that the present invention is a significant improvement over test apparatus heretofore developed since the present system does not require a dedicated return path to the transmitter since the reference signal is applied to receiver 60 on all available wires that are not being interrogated for a given test. Thus, the reference set of wires which are connected to bus 64 by their corresponding shunt diodes is that set of wires within the group which is mathematically complementary to the test set which is being interrogated during the application of each test signal. Accordingly, it should be readily understood that transmitter 20 cycles through the sets A-D which, in turn, encompasses all wires to be tested; during this cycle, transmitter 20 sequentially interrogates each test set and then repeating the cycle.

While the above description provides a positive reference voltage signal and a "ground" test signal, it will readily be apparent that the transmitter circuit may be modified so that the test signal is a positive voltage and the reference signal is ground potential. This modified transmitter circuit necessitates the corresponding reversal of the shunt and indicator diodes in the indicator circuits of the receiver. The provision of multiple reference signal paths through the tested cable harness can thus be seen to be accomplished by different circuits.

From the foregoing, it should be appreciated that the present invention provides a method to test the integrity of a plurality of individually electrically conductive wires which ordinarily define a cable between two stations. The preferred broad method includes the first step of providing a common electrical bus at the receiving end of a group of wires to be tested, and electrically interconnecting each of their receiver ends of the wires to be tested to the common electrical bus by means of an indicator circuit wherein each indicator circuit includes indicator means for generating an active output and wherein at least some of the indicator circuits, but preferably all, include electrical shunts. The next step in this method is then the application of the test signal at a test voltage to a selected test set of wires in the group of wires to be tested at the transmitter end and simultaneously applying a reference signal at a reference voltage different from the test voltage to a selected reference set of wires in the group to be tested at the transmitter end. The final step in the broad process then is the generation of an active output for each indicator circuit that receives a test signal while coupling the reference voltage to the common electrical bus through each shunt for each indicator circuit that receives a reference signal so that no active output is produced by the respective indicator means thereof.

The broad method set forth above can further include the steps of stabilizing the reference voltage at the common electrical bus, the step of separating the group of wires into a plurality of test sets with the test sets being mathematically non intersecting sets with respect to one another and sequentially applying the test signal to each set and the reference signal to the corresponding reference set. This sequential application of signals may be repeated at periodic intervals. As noted with respect to the apparatus described, the preferred method prefers that the reference signal be applied to that set of wires which is mathematically complementary set to the respective test set being addressed, and it is preferred that the test voltage be a ground voltage signal whereas the reference signal be a positive voltage in order to minimize current drain on the circuit. The active outputs of the indicators are visually displayed, then, in any convenient manner.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

We claim:

1. Apparatus adapted for testing the integrity of a plurality of individual electrically conductive wires which define a cable that normally extends between two stations, comprising:
   a transmitter portion having a plurality of first electrical contacts operative to establish electrical communication with a first end of each member of a group of wires to be tested, said transmitter portion having signal generating and control means for producing a test signal at a test voltage and a reference signal at a reference voltage of different electrical potential from test voltage and for applying the test signal to a test set of wires in said group and the reference signal to a reference set of wires in said group, said test set and said reference set being non-mathematically intersecting;

a receiver portion having a plurality of second electrical contacts operative to establish electrical communication with a second end of each member of said group of wires opposite the first ends thereof, said receiver portion having a common electrical bus and a plurality of indicator circuits with there being an indicator circuit interconnecting each said second electrical contact and said common electrical bus, each said indicator circuit having an indicator means for generating an active output in response to the presence of the test signal at its respective second electrical contact and a plurality of said indicator circuits having an electrical shunt means for placing said common electrical bus at said reference voltage without said indicator means generating said active output in response to the present of the reference signal at its respective second electrical contact so that when the test voltage is applied to the test set of wires a plurality of circuit paths are available to place the common electrical bus at the reference voltage; and power source means for supplying electrical power to said transmitter and said receiver devices.

2. Apparatus according to claim 1 wherein each said electrical shunt means including a first diode with said first diodes being commonly biased with respect to said common electrical bus.

3. Apparatus according to claim 2 wherein said indicator means each include a light emitting diode with said light emitting diodes being commonly biased with respect to said common electrical bus and oppositely biased with respect to said first diodes.

4. Apparatus according to claim 2 wherein said indicator circuits each include second diodes commonly biased with respect to said common electrical bus and oppositely biased with respect to said first diodes, there being a said indicator means and a said second diode in series with one another and in parallel to a respective said first diode.

5. Apparatus according to claim 4 wherein each said indicator means includes an LCD cell.

6. Apparatus according to claim 1 wherein said signal and control means sequentially applies said test signal to a plurality of test sets of wires in said group and wherein said signal and control means sequentially applies said reference signal to a plurality of reference sets of wires in said group of wires said test sets and said reference sets being in correspondence so that there is a distinct reference set for each respective test set, each said test set and its respective reference set being non-mathematically intersecting.

7. Apparatus according to claim 6 wherein signal and control means is operative to repeatedly cycle the application of the test signal to said test sets and the reference signal to said reference sets.

8. Apparatus according to claim 7 wherein said signal and control means includes a clock which produces clock pulses at first periodic intervals and a decade counter driven by said pulses and having a plurality of voltage outputs in correspondence with said test sets whereby each test set is electrically connected to a respective voltage output.

9. Apparatus according to claim 8 wherein the product of the first periodic interval and the number of said voltage outputs corresponding to said test set determines the cycle period for said signal and control means.

10. Apparatus according to claim 9 wherein said signal and control means includes means for varying said first periodic interval.

11. Apparatus according to claim 6 wherein each said reference set of wires is the set of wires in said group of wires mathematically complementary to a respective test set.

12. Apparatus according to claim 1 wherein said reference signal is a positive voltage signal and said test signal is of lower voltage than said positive voltage.

13. Apparatus according to claim 1 wherein said test signal is a positive voltage signal and said reference signal is of lower voltage than said positive voltage.

14. Apparatus according to claim 1 wherein said indicator circuit include means for stabilizing the electrical potential of said common electrical bus.

15. Apparatus according to claim 1 wherein said power source means comprises a battery.

16. Apparatus according to claim 15 wherein said battery is located in said transmitter device, said receiver device being a separate module from said transmitter device and being remotely powered by said battery through the group of wires to be tested.

17. Apparatus according to claim 1 including first adapter means for electronically interconnecting the first ends of the wires in said group to said first electrical contacts and second adapter means for electrically interconnecting the second ends of the wires in said group to said second electrical contacts.

18. Apparatus adapted for testing the integrity of a plurality of individual electrically conductive wires which define a cable that normally extends between two stations comprising:

a transmitter portion having a plurality of first electrical contacts operative to establish electrical communications with a first end of each member of a group of wires to be tested, said transmitter portion having signal generating and control means for producing a test signal at a test voltage and a reference signal at a reference voltage of different electrical potential from the test voltage and for sequentially applying the test signal to a plurality of test sets of wires in said group and the reference signal to a complementary reference sets of wires in said group, each said test set and its respective complementary reference set of wires that are a non-mathematically intersecting;

a receiver portion have a plurality of second electrical contacts operative to establish electrical communication with a second end of each member of said group of wires opposite the first ends thereof, said receiver portion having a common electrical bus and a plurality of indicator circuits with there being an indicator circuit interconnecting each said second electrical contact and said common electrical bus, each said indicator circuit having an indicator means for generating an active output in response to the presence of the test signal at its respective second electrical contact and a plurality of said indicator circuits having electrical shunt means for placing said common electrical bus at said reference voltage without said indicator means generating said active output in response to the present of the reference signal at its respective second electrical contact, there being a plurality of electrical shunt means associated with each complementary reference set of wires whereby a plurality of circuit paths for placing said electrical bus at said reference voltage are available for each said complementary reference set; and power source means for supplying electrical power to said transmitter and receiver means.

19. Apparatus according to claim 18 wherein the reference set corresponding to each test set comprises the set of all wires in said group of wires other than the respective test set.

20. Apparatus according to claim 19 wherein each said electrical shunt means including a first diode with said first diodes being commonly biased with respect to said common electrical bus.

21. Apparatus according to claim 20 wherein said indicator means each include an indicator element and a second diode with said second diodes being commonly biased with respect to said common electrical bus and oppositely biased with respect to said first diodes.

22. Apparatus according to claim 18 wherein signal and control means is operative to repeatedly cycle the application of the test signal to said test sets and the reference signal to said reference sets.

23. Apparatus according to claim 18 wherein said indicator circuit include means for stabilizing the electrical potential of said common electrical bus.

24. A method of testing the integrity of a plurality of individual electrically conductive wires defining a cable between two stations, comprising the steps of:

providing a common electrical bus at a receiver end of a group of wires to be tested;

electrically interconnecting each of said receiver ends and said common electrical bus by an indicator circuit, each said indicator circuit including indicator means for generating an active output and an electrical shunt;

applying a test signal at a test voltage to a selected test set of wires in said group of wires to be tested at a transmitter end of each of said wires opposite the receiver end thereof; and simultaneously applying a reference signal at a reference voltage different from said test voltage to a selected reference set of wires in said group of wires to be tested at said transmitter ends thereof; and generating said active output for each said indicator circuit that receives a test signal at the receiver end of its respective wire and coupling said reference voltage to said common electrical bus through each shunt for each indicator circuit that receives a reference signal at the receiver end of its respective wire without producing an active output by its respective indicator means.

25. The method according to claim 24 further including the step of stabilizing the reference voltage at the common electrical bus.

26. The method according to claim 24 including the step of separating said group of wires into a plurality of test sets of wires each having a corresponding said reference set of wires, said test sets being mathematically non-intersecting and including the step of sequentially applying both the test signal to each set and the reference signal to corresponding reference set to define a test cycle.

27. The method according to claim 26 including the step of repeating the test cycle at periodic intervals.

28. The method according to claim 26 wherein the reference set of wires for each respective test set of wires is mathematically complementary thereto with respect to the group of wires to be tested.

29. The method according to claim 24 wherein the reference voltage is positive and the test voltage is less than the reference voltage.

30. The method according to claim 24 wherein the test voltage is positive and the reference voltage is less than the test voltage.

31. The method according to claim 24 including the step of visually displaying each of said active outputs.

32. Apparatus adapted for testing the integrity of a plurality of individual electrically conductive wires which define a cable that normally extends between two stations, comprising:

a transmitter portion having a plurality of first electrical contacts operative to establish electrical communication with a first end of each member of a group of wires to be tested, said transmitter portion having signal generating and control means for producing a test signal at a test voltage and a reference signal at a reference voltage of different electrical potential from test voltage and for applying the test signal to a test set of wires in said group and the reference signal to a reference set of wires in said group said signal and control means automatically and cyclically applying said test signal to a plurality of mathematically non intersecting test sets of wires in said group, said group of wires formed by a mathematical union of said test sets, and wherein said signal and control means automatically and cyclically applying said reference signal to a plurality of reference sets of wires in said group of wires;

a receiver portion having a plurality of second electrical contacts operative to establish electrical communication with a second end of each member of said group of wires opposite the first ends thereof, said receiver portion having a common electrical bus and a plurality of indicator circuits with there being an indicator circuit interconnecting each said second electrical contact and said common electrical bus, each said indicator circuit having an indicator means for generating an active output in response to the presence of the test signal at its respective second electrical contact and some of said indicator circuits having an electrical shunt means for placing said common electrical bus at said reference voltage without said indicator means generating said active output in response to the present of the reference signal at its respective second electrical contact; and power source means for supplying electrical power to said transmitter and said receiver devices.

* * * * *